United States Patent
Kasahara

(10) Patent No.: US 10,305,257 B2
(45) Date of Patent: May 28, 2019

(54) SEMICONDUCTOR LASER DEVICE

(71) Applicant: NICHIA CORPORATION, Anan-shi, Tokushima (JP)

(72) Inventor: Daiji Kasahara, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/164,330

(22) Filed: May 25, 2016

(65) Prior Publication Data

US 2016/0352077 A1   Dec. 1, 2016

(30) Foreign Application Priority Data

May 26, 2015 (JP) .................. 2015-106077

(51) Int. Cl.
| | | |
|---|---|---|
| *H01S 5/20* | (2006.01) | |
| *H01S 5/34* | (2006.01) | |
| *H01S 5/343* | (2006.01) | |

(52) U.S. Cl.
CPC ........ *H01S 5/34333* (2013.01); *H01S 5/2004* (2013.01); *H01S 5/3407* (2013.01); *H01S 5/2009* (2013.01)

(58) Field of Classification Search
CPC .. H01S 5/34333; H01S 5/2004–5/2013; H01S 5/3409; H01S 5/3407
See application file for complete search history.

(56) References Cited

U.S. PATENT DOCUMENTS 5,591,260 A  *  1/1997  Kishi .................. C30B 25/02
                                                                 117/104
6,417,520 B1 *  7/2002  Kano .................. H01L 33/10
                                                                 257/13

(Continued)

FOREIGN PATENT DOCUMENTS

JP    H10-242512 A    9/1998
JP    2002-261393 A   9/2002

(Continued)

OTHER PUBLICATIONS

Office Action dated Apr. 4, 2017 in corresponding Japanese Patent Application No. 2015-106077.

*Primary Examiner* — Xinning(Tom) Niu
*Assistant Examiner* — Sean P Hagan
(74) *Attorney, Agent, or Firm* — Foley & Lardner LLP

(57) ABSTRACT

A semiconductor laser device includes an n-type nitride semiconductor layer; a first layer disposed above the n-type nitride semiconductor and composed of $In_aGa_{1-a}N$ ($0 \leq a < 1$); a second layer disposed above the first layer and composed of $In_bGa_{1-b}N$ ($0 < b < 1$, $a < b$), the second layer having a thickness smaller than that of the first layer and containing an n-type impurity; a third layer composed of $In_cGa_{1-c}N$ ($0 \leq c < 1$, $c < b$) and having a thickness smaller than that of the second layer, the third layer being disposed on (i) a surface of the second layer on the active layer side and/or (ii) a surface of the second layer on the first layer side; an active layer disposed above the second layer and the third layer, and having a single quantum well structure or a multiple quantum well structure; and a p-type nitride semiconductor layer disposed above the active layer.

22 Claims, 5 Drawing Sheets

(56) References Cited

U.S. PATENT DOCUMENTS

| | | | |
|---|---|---|---|
| 6,466,597 B1* | 10/2002 | Kume | B82Y 20/00 257/103 |
| 6,849,881 B1 | 2/2005 | Harle et al. | |
| 2002/0171091 A1 | 11/2002 | Goetz et al. | |
| 2003/0005880 A1* | 1/2003 | Razeghi | B82Y 20/00 117/86 |
| 2005/0116216 A1 | 6/2005 | Harle et al. | |
| 2006/0038191 A1* | 2/2006 | Onishi | H01S 5/18394 257/96 |
| 2006/0097242 A1* | 5/2006 | Kuramoto | B82Y 20/00 257/13 |
| 2010/0150194 A1* | 6/2010 | Tsuchiya | B82Y 20/00 372/45.01 |
| 2010/0189148 A1 | 7/2010 | Kyono et al. | |
| 2011/0037049 A1 | 2/2011 | Tachibana et al. | |
| 2016/0056333 A1* | 2/2016 | Takeuchi | H01S 5/18361 257/76 |

FOREIGN PATENT DOCUMENTS

| | | |
|---|---|---|
| JP | 2002-314129 A | 10/2002 |
| JP | 2004-031770 A | 1/2004 |
| JP | 2004-87763 A | 3/2004 |
| JP | 2004-087908 A | 3/2004 |
| JP | 2009-200437 A | 9/2009 |
| JP | 2010-141242 A | 6/2010 |
| JP | 2011-035433 A | 2/2011 |
| JP | 2013-98232 A | 5/2013 |
| WO | WO-2011/021264 A1 | 2/2011 |

\* cited by examiner

SEMICONDUCTOR LASER DEVICE

CROSS-REFERENCE TO RELATED APPLICATION

This application claims priority to Japanese Patent Application No. 2015-106077, filed on May 26, 2015. The entire disclosure of Japanese Patent Application No. 2015-106077 is hereby incorporated herein by reference.

BACKGROUND

1. Technical Field

The present disclosure relates to a semiconductor laser device.

2. Description of the Related Art

Nowadays, nitride-based semiconductor laser devices can oscillate in ultraviolet to green ranges, and are used not only in light sources for optical discs but also in a variety of applications. Particularly, semiconductor laser devices which have the laser emission wavelength of blue or green, 430 nm or more, are expected to be applied to light sources for displays such as projectors and televisions.

There has been proposed a nitride-based semiconductor laser device including: an n-type clad layer; a n-side light guide layer containing an InGaN region; an active layer; a p-side light guide layer containing an InGaN region; and a p-type clad layer. The nitride-based semiconductor laser device includes barrier layers between the outermost well layer and the n-side and p-side light guide layers. The barrier layers have a band gap larger than the band gap of the InGaN region of each of the n-side and p-side light guide layers (e.g. Japanese Patent Application No. 2009-200437 A).

For a nitride-based semiconductor laser device which oscillate laser light having a long laser emission wavelength, various structures have been proposed, but there is still room for improvement in these structures.

SUMMARY

Various embodiments of the inventions are described below.

In one embodiment, semiconductor laser device includes an n-type nitride semiconductor layer; a first layer disposed above the n-type nitride semiconductor and composed of $In_aGa_{1-a}N$ ($0 \le a < 1$); a second layer disposed above the first layer and composed of $In_bGa_{1-b}N$ ($0 < b < 1$, $a < b$), the second layer having a thickness smaller than that of the first layer and containing an n-type impurity; a third layer disposed on at least any one of a surface of the second layer on the active layer side and a surface of the second layer on the first layer side, the third layer being composed of $In_cGa_{1-c}N$ ($0 \le c < 1$, $c < b$) and having a thickness smaller than that of the second layer; an active layer disposed above the second layer and the third layer, and having a single quantum well structure or a multiple quantum well structure; and a p-type nitride semiconductor layer disposed above the active layer. The semiconductor laser device having a laser emission wavelength of 430 nm or more.

In another embodiment, a method of manufacturing a semiconductor laser device includes forming an n-type nitride semiconductor layer; forming a first layer composed of $In_aGa_{1-a}N$ ($0 \le a < 1$) above the n-type nitride semiconductor layer; forming a second layer and a third layer above the first layer, the second layer having a thickness smaller than that of the first layer, being composed of $In_bGa_{1-b}N$ ($0 < b < 1$, $a < b$), and doped with an n-type impurity so as to have an electron carrier concentration of $1 \times 10^{18}/cm^3$ or more, the third layer being disposed on at least any one of a surface of the second layer on the active layer side and a surface of the second layer on the first layer side, having a thickness smaller than that of the second layer, and being composed of $In_cGa_{1-c}N$ ($0 \le c < 1$, $c < b$); forming an active layer having a single quantum well structure or a multiple quantum well structure above the second layer and the third layer; and forming a p-type nitride semiconductor layer above the active layer.

In another embodiment, a method of manufacturing a semiconductor laser device includes forming an n-type nitride semiconductor layer; forming a first layer composed of $In_aGa_{1-a}N$ ($0 \le a < 1$) above the n-type nitride semiconductor layer; forming a second layer and a third layer above the first layer, the second layer having a thickness smaller than that of the first layer, being composed of $In_bGa_{1-b}N$ ($0 < b < 1$, $a < b$), and doped with an n-type impurity so as to have an n-type impurity concentration of $1 \times 10^{19}/cm^3$ or more, the third layer being disposed on at least any one of a surface of the second layer on the active layer side and a surface of the second layer on the first layer side, having a thickness smaller than that of the second layer, and being composed of $In_cGa_{1-c}N$ ($0 \le c < 1$, $c < b$); forming an active layer having a single quantum well structure or a multiple quantum well structure above the second layer and the third layer; and forming a p-type nitride semiconductor layer above the active layer.

One advantage of the semiconductor laser device according to certain embodiments is that it is capable of reducing a piezoelectric field while reducing deterioration of crystallinity, and capable of improving electron injection efficiency and reducing overflow of holes. According to the method of manufacturing according to certain embodiments, a semiconductor laser device, a semiconductor laser device can be manufactured which is capable of reducing a piezoelectric field while reducing deterioration of crystallinity, and capable of improving injection efficiency and reducing overflow of holes.

DETAILED DESCRIPTION

Hereinafter, embodiments of the present invention will be described with reference to the drawings. It is to be noted that the embodiments shown below are intended to illustrate a method of implementing the technical concept of the present invention. The present invention is not limited to the following embodiments. Further, in the following description, like names and reference numbers show like members or members of like natures, and detailed descriptions thereof are appropriately omitted.

Figure 1:
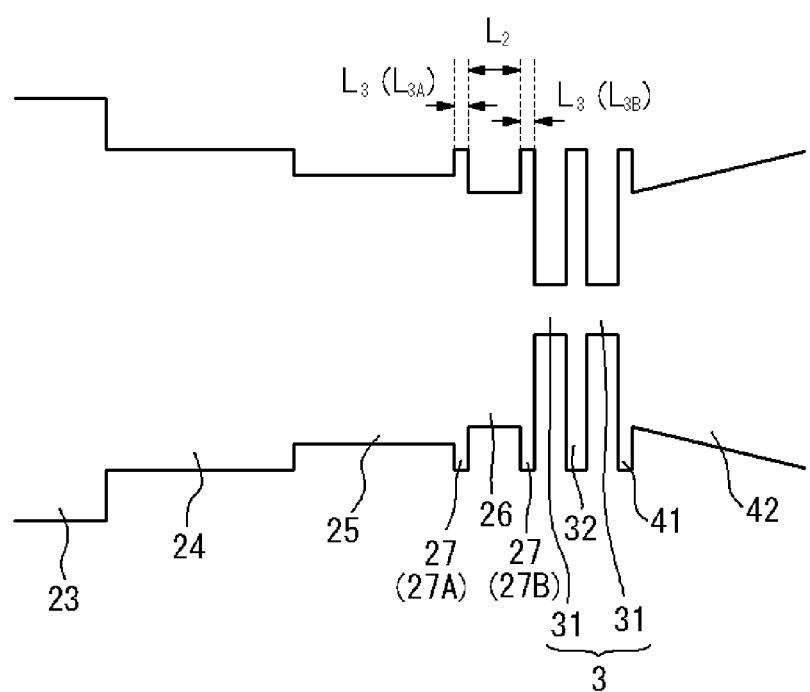
FIG. 1 is a view schematically showing a band gap energy of a semiconductor laser device according to an embodiment.
Figure 2:
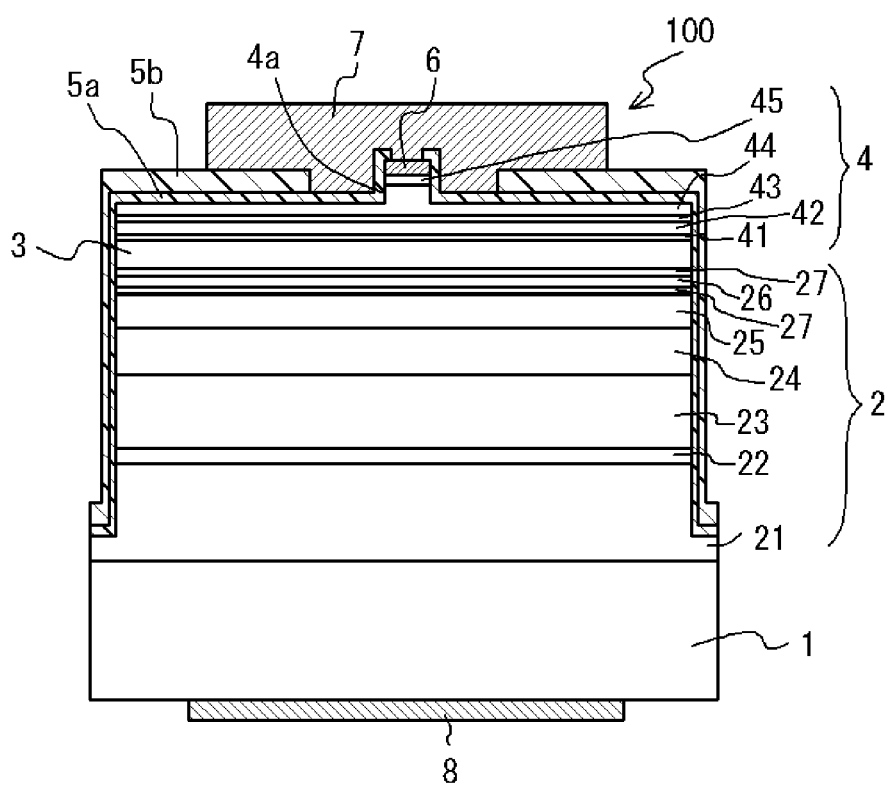
FIG. 2 is a schematic sectional view of the semiconductor laser device according to the embodiment.

FIG. 1 is a view schematically showing a band gap energy of a semiconductor laser device according to this embodiment. FIG. 2 is a schematic sectional view of the semiconductor laser device 100 according to this embodiment, where a cross section of the semiconductor laser device 100 in a direction perpendicular to a cavity resonator direction. The semiconductor laser device 100 includes an active layer 3 having a single quantum well structure or a multiple quantum well structure, and a p-type nitride semiconductor layer (e.g. second p-type semiconductor layer 44) and an n-type nitride semiconductor layer (e.g. third n-type semiconductor layer 23) disposed, respectively, on both sides of the active layer 3. The laser emission wavelength of the semiconductor laser device is 430 nm or more. A first layer 25 composed of $In_aGa_{1-a}N$ ($0 \leq a < 1$) and a second layer 26 having a thickness smaller than that of the first layer 25 and composed of $In_bGa_{1-b}N$ ($0 < b < 1$, $a < b$) are disposed in this order from the n-type nitride semiconductor layer side between the n-type nitride semiconductor layer and the active layer 3. At least one third layer 27 having a thickness smaller than that of the second layer 26 and composed of $In_cGa_{1-c}N$ ($0 \leq c < 1$, $c < b$) is disposed on at least any one of a surface of the second layer 26 on the active layer 3 side and a surface of the second layer 26 on the first layer side. The second layer 26 contains an n-type impurity. FIG. 1 shows an example in which the third layers 27 are provided on both surfaces of the second layer 26.

The active layer 3 shown in FIG. 1 has a multiple quantum well structure, and includes two well layers 31 and one barrier layer 32 (intermediate barrier layer) sandwiched therebetween. A p-side barrier layer 41 (outside barrier layer), for example, composed of GaN, is disposed on the active layer 3 on the p-type nitride semiconductor layer side. On the outside thereof, a fourth layer 42, for example, the composition of which changes gradually from InGaN to GaN as going away from the active layer 3, is disposed.

Hereinafter, a mechanism will be described in which the characteristics of the nitride semiconductor laser device are improved by providing the second layer 26.

First, the reason it is preferred that the second layer 26 provided between the first layer 25 and the active layer 3 contains an n-type impurity will be described.

A typical nitride-based semiconductor laser device includes an active layer of multiple quantum well structure including two or more well layers and an intermediate barrier layer disposed therebetween for obtaining a sufficient gain. However, in a nitride semiconductor, the effective mass of holes is larger than that of electrons, and therefore when the thickness of the intermediate barrier layer is large, imbalance in gain for each well layer easily occurs, and the operating voltage easily increases. When the intermediate barrier layer is thin, imbalance in gain for each well layer can be reduced, and the operating voltage can be decreased, but conversely, overflow of holes easily occurs under a high-current operation, so that slope efficiency may be deteriorated. When a single quantum well structure with a single well layer is employed, a phenomenon specific to a multiple quantum well structure in which the gain varies for each well layer does not occur, but it is difficult to obtain a sufficient gain and overflow of holes may occur under high-current operation.

Thus, in this embodiment, the second layer 26 containing an n-type impurity is provided on the n-type nitride semiconductor layer side of the active layer 3. By disposing the second layer 26 near the active layer 3, overflow of holes can be reduced, so that a semiconductor laser device having improved slope efficiency can be obtained. When the second layer 26 contains an n-type impurity, electron injection efficiency is improved to contribute to decrease in a threshold current. Further, a multiple quantum well structure as active layer 3 can reduce deterioration of slope efficiency, although the thin barrier layer 32 sandwiched between the well layers 31 is employed. In other words, when the barrier layer 32 is thin, overflow of holes easily occurs, but the overflow can be reduced by the second layer 26, and therefore deterioration of slope efficiency can be reduced. By employing the thin barrier layer 32, the operating voltage can be decreased, and further, imbalance in gain for each well layer 31 can be reduced, so that a semiconductor laser device having a lower threshold current can be provided.

Next, the reason it is preferred that the second layer 26 is composed of InGaN, which has an In composition ratio higher than that of the first layer 25, and the third layer 27 having an In composition ratio lower than that of the second layer 26 is provided on at least one, preferably both, of the surfaces of the second layer 26 will be described.

In a nitride-based semiconductor laser device that oscillates in the visible light region, InGaN is normally used as a well layer in an active layer. In an n-type semiconductor layer and a p-type semiconductor layer which sandwich the active layer therebetween, for example, AlGaN is used as a clad layer, and GaN, or InGaN having an In composition ratio lower than that of the well layer in the active layer is used as a guide layer. It is known that the lattice constant of a nitride semiconductor depends on the composition ratio of Al, In and Ga, and when an active layer (well layer) is formed above a layer having a small lattice constant, such as a clad layer, compressive strain is applied to the well layer to generate a piezoelectric field. The piezoelectric field spatially separates the wave functions of holes and electrons to decrease the carrier recombination probability. Accordingly, the threshold current of the semiconductor laser device increases, leading to deterioration of slope efficiency. Thus, in this embodiment, the second layer 26 which is thinner and has a higher composition ratio of In as compared to the first layer 25 is provided on the n-type nitride semiconductor layer side of the active layer 3. Accordingly, strain applied to the active layer 3 (well layer 31) can be reduced to decrease the threshold current and improve the slope efficiency. Particularly, it is known that as the laser emission wavelength becomes longer, a difference of lattice constant between the well layer 31 and layers around the well layer 31 increases, and therefore the layers in a semiconductor laser device is more significantly influenced by the piezoelectric field. Accordingly, this configuration is preferably used for a semiconductor laser device having a long laser emission wavelength. For example, the long laser emission wavelength is 430 nm or more.

In InGaN, the refractive index increases as the In composition ratio increases, and therefore when the second layer 26 having an In composition ratio higher than that of the first layer 25 is disposed near the active layer 3, the second layer 26 can serve also as a core layer. Thus, the light confinement coefficient of the semiconductor laser device can be increased, so that the threshold current can be decreased and/or the slope efficiency can be improved. On the other hand, InGaN having a high In composition ratio is easily three-dimensionally grown, and therefore, when the active layer 3 is grown directly after the first layer 25 and the second layer 26 are grown, the well layer 31 is also three-dimensionally grown easily, or crystal defects such as dislocation tend to easily occur. If such a low-quality active layer 3 is formed, it may be unable to obtain a sufficient effect by the second layer 26. Thus, a thin layer having an In composition ratio lower than that of the second layer 26, such as a layer of GaN, is grown as the third layer 27 between the first layer 25 and the second layer 26 and/or between the second layer 26 and the active layer 3. Accordingly, three-dimensional growth of the well layer 31 can be reduced, so that the active layer 3 of high quality can be grown, and therefore a sufficient effect of, for example, decreasing the threshold current by providing the second layer 26 can be obtained.

Hereinafter, the members will be described in detail.

Semiconductor Laser Device 100

As shown in FIG. 2, the semiconductor laser device 100 includes, on a substrate 1, an n-side region 2 having an n-type nitride semiconductor layer; the active layer 3; and a p-side region 4 having a p-type nitride semiconductor layer. A surface of the p-side region 4 is provided with, for example, a ridge 4a. When the ridge 4a is provided, a section of the active layer 3 immediately below the ridge 4a, and the vicinity thereof serve as a waveguide region. A first insulating film 5a can be provided on a side surface of the ridge 4a and a surface of the p-side region 4 continuously extending from the side surface of the ridge 4a, and a second insulating film 5b that covers a part of the first insulating film 5a can be provided on the first insulating film 5a. The substrate 1 is of n-type, and on the lower surface thereof, an n-electrode 8 is provided. A p-electrode 6 is provided in contact with the ridge 4a on the surface of the p-side region 4, and further, a p-side pad electrode 7 is provided thereon. The first insulating film 5a may cover a part of the p-electrode 6.

As described above, the layers in the semiconductor laser device are more significantly influenced by the piezoelectric field as the laser emission wavelength becomes longer, and therefore the effect by providing the second layer 26 is especially high when the laser emission wavelength of the semiconductor laser device 100 is 430 nm or more. The phrase "the laser emission wavelength of the semiconductor laser device 100 is 430 nm or more" means that the peak wavelength of laser light oscillated by the semiconductor laser device 100 is 430 nm or more. The semiconductor laser device 100 may have a relatively low optical output power of, for example, several tens mW, but since the effect by providing the second layer 26 is higher under a high-current operation, the semiconductor laser device 100 is preferably a device which can be driven with a relatively high current (device having a relatively high output power). Such a semiconductor laser device 100 is a device which can be driven with a current of, for example, 1 A or more, or a device having an optical output power of, for example, 1 W or more. Especially preferably, the semiconductor laser device 100 can be driven with a current of about 2 A or more. The optical output power of the semiconductor laser device 100 is especially preferably 3 W or more. Such a semiconductor laser device 100 is, for example, a device in which the width of the ridge 4a (or width of the waveguide region) is about 10 μm to 50 μm.

Substrate 1

As the substrate 1, a nitride semiconductor substrate composed of, for example, GaN or AlN can be used. A different kind of substrate other than a nitride semiconductor substrate, for example an insulating substrate such as that of sapphire, a semiconductor substrate such as that of SiC, Si, ZnO, $Ga_2O_3$ or GaAs, or a template substrate with a nitride semiconductor grown on glass may be used. The effect by providing the second layer 26 etc. may be especially high on the c-plane which is a polar face. This is because in a device with each semiconductor layer grown on a c-plane ((0001) plane) GaN substrate, the piezoelectric field is applied to a well layer. Therefore, a substrate (GaN substrate, sapphire substrate or the like) with the c-plane as a principal surface is preferably used as the substrate 1. Here, the substrate with the c-plane as a principal surface may have an off angle of about 0 to 1 degrees.

N-Side Region 2

The n-side region 2 can be formed as a multi-layer structure composed of a nitride semiconductor. Examples of the n-type semiconductor layer included in the n-side region 2 may include layers composed of a nitride semiconductor containing an n-type impurity such as Si or Ge. For example, the n-side region 2 includes a first n-type semiconductor layer 21, a second n-type semiconductor layer 22, a third n-type semiconductor layer 23 (this layer is defined as an n-type nitride semiconductor layer in this embodiment), a fourth n-type semiconductor layer 24, the first layer 25 and the second layer 26 in this order from the substrate 1, with the third layer 27 disposed above and/or below the second layer 26. Layers other than these layers may be included in the n-side region 2, or some of these layers may be omitted.

First to Fourth N-Type Semiconductor Layers 21 to 24

The first to fourth n-type semiconductor layers 21 to 24 may contain an n-type impurity. The first n-type semiconductor layer 21 is composed of, for example, AlGaN. The second n-type semiconductor layer 22 is composed of, for example, InGaN. The In composition ratio of the second n-type semiconductor layer 22 is preferably lower than that of the well layer 31, and may be comparable to that of the second layer 26. The third n-type semiconductor layer 23 is composed of, for example, $Al_iGa_{1-i}N$ ($0 \leq i < 1$) having a band gap energy larger than that of the first layer 25. The band gap energy of the third n-type semiconductor layer 23 is preferably larger than that of the first n-type semiconductor layer 21. The third n-type semiconductor layer 23 may have the maximum band gap energy at the n-side region 2, and typically serves as an n-type clad layer. The thickness of the third n-type semiconductor layer 23 is, for example, about 0.7 to 1.2 μm. The fourth n-type semiconductor layer 24 is composed of, for example, GaN. When the fourth n-type semiconductor layer 24 is provided, it is preferred that the fourth n-type semiconductor layer 24 has a band gap energy and/or lattice constant thereof which is equal to that of the first layer 25 or which is between that of the first layer 25 and that of the third n-type semiconductor layer 23. For example, the thickness of the fourth n-type semiconductor layer 24 is smaller than the thickness of the third n-type semiconductor layer 23.

First Layer 25

The first layer 25 is composed of $In_aGa_{1-a}N$ ($0 \leq a < 1$). The first layer 25 may be composed of InGaN or GaN. Preferably, the first layer 25 has a band gap energy smaller than that of the n-type nitride semiconductor layer (e.g. third n-type semiconductor layer 23) and/or a lattice constant larger than the n-type nitride semiconductor layer. The lattice constant of the first layer 25 is preferably a value between the lattice constants of the n-type nitride semiconductor layer and the second layer 26, or between the lattice constants of the fourth n-type semiconductor layer 24 and the second layer 26 when the fourth n-type semiconductor layer 24 exists. Accordingly, the lattice constant can be increased stepwise as going from the n-type nitride semiconductor layer toward the active layer 3, and therefore strain applied to the active layer 3 (well layer 31) can be reduced, so that influences of the piezoelectric field can be reduced. The In composition ratio a of the first layer 25 may be 0.025 or more, and may be less than 0.2.

The first layer 25 may be doped with a small amount of an n-type impurity, or undoped. When the first layer 25 contains an n-type impurity, the concentration thereof is preferably smaller than the concentration of an n-type impurity in the n-type semiconductor layer (e.g. third n-type semiconductor layer 23). The first layer 25 serves as, for example, a n-side guide layer. The thickness of the first layer 25 is preferably larger than the second layer 26. When the first layer 25 is composed of InGaN, crystallinity may be deteriorated with an increase in thickness, and therefore the thickness of the first layer 25 is preferably 350 nm or less, further preferably 300 nm or less. The thickness of the first layer 25 is preferably 40 nm or more.

Second Layer 26

Preferably, the second layer 26 has a thickness smaller than that of the first layer 25, and is composed of $In_bGa_{1-b}N$ (0<b<1). The In composition ratio b of the second layer 26 is preferably higher than the In composition ratio a of the first layer 25 (i.e. a<b). An effect of reducing strain on the active layer 3 may be obtained by providing the second layer 26. The In composition ratio b of the second layer 26 may be higher than 0.025, and may be 0.2 or less, and may be made higher than the In composition ratio a of the first layer 25 within this range. Preferably, the In composition ratio b of the second layer 26 and the In composition ratio d of the later described barrier layer 32 or the In composition ratio e of the well layer 31 satisfy the relationship of d<b and b<e, further preferably b<e/2.

Preferably, the second layer 26 contains an n-type impurity. Examples of the n-type impurity include Si and Ge. The electron carrier concentration (n-type impurity concentration) and/or thickness of the second layer 26 is preferably above a certain level for reducing overflow of holes and improving electron injection efficiency. The second layer 26 also serves as a light absorbing layer. It is preferred that the electron carrier concentration (n-type impurity concentration) and/or thickness of the second layer 26 is not excessively large in view of reducing the deterioration of crystallinity. Specifically, a range of values as shown below is preferred.

The electron carrier concentration of the second layer 26 is preferably $1\times10^{18}/cm^3$ or more, further preferably $1\times10^{19}/cm^3$ or more. The electron carrier concentration of the second layer 26 is preferably $1\times10^{20}/cm^3$ or less, further preferably $3\times10^{19}/cm^3$ or less. When the electron carrier concentration of the second layer 26 is to be set, for example, the Hall measurement is conducted for a film formed with a sufficient thickness (e.g. about 100 nm). When the result of the measurement shows that the electron carrier concentration of the film is a desired value, the second layer 26 is formed under the similar growth conditions as those for the film for the measurement (e.g. at the similar flow rate of an n-type impurity source gas). This is because layers having different thicknesses, nevertheless, may be considered to have the similar electron carrier concentration as long as they are formed under the similar growth conditions. Since the electron carrier concentration is normally lower than the n-type impurity concentration, the n-type impurity concentration of the second layer 26 is preferably higher than the lower limit of the electron carrier concentration, and is, for example, $1\times10^{19}/cm^3$ or more. It is preferred that the electron carrier concentration of the second layer 26 is set to be the highest in the n-side region 2. Being the highest in the n-side region 2 means being the highest in the range, for example, from a layer that is in contact with the substrate 1 (first n-type semiconductor 21 in the example shown in FIGS. 1 and 2) to a layer that is in contact with the active layer 3 (third layer 27B in the example shown in FIGS. 1 and 2). Preferably, the second layer 26 has an electron carrier concentration (n-type impurity concentration) higher than that of the active layer 3. Preferably, the second layer 26 also has the highest n-type impurity concentration in the n-side region 2.

The thickness of the second layer 26 is preferably not less than 1 nm and not more than 30 nm. Further, the thickness of the second layer 26 is preferably 5 nm or more, and preferably 10 nm or less.

Preferably, the second layer 26 is disposed near the active layer 3. Specifically, the shortest distance between one of well layers 31 in the active layer 3 that is disposed on a side closest to the n-type nitride semiconductor layer (n-side outermost well layer) and the second layer 26 is preferably 10 nm or less. Accordingly, the effect by providing the second layer 26 can be more reliably obtained. When the third layer 27B is provided between the second layer 26 and the n-side outermost well layer, the shortest distance between the second layer 26 and the n-side outermost well layer is preferably 10 nm or less. As shown in FIG. 1, the third layer 27B may be in contact with the n-side outermost well layer. When the third layer 27B is not provided, it is preferred that the second layer 26 is in contact with the n-side outermost well layer.

Preferably, only one second layer 26 is disposed between the first layer 25 and the active layer 3. In other words, it is preferred that a layer having the same composition as that of the second layer 26 does not exist between the first layer 25 and the active layer 3, except for one second layer 26.

Third Layer 27

The third layer 27 is disposed on at least any one of a surface of the second layer 26 on the active layer 3 side and a surface of the second layer 26 on the first layer 25 side. Only one of the third layer 27A and the third layer 27B may be provided, or both of them may be provided. The semiconductor laser device shown in FIG. 1 includes two third layers 27 (27A and 27B), with the third layer 27A being disposed on the second layer 26 on the first layer 25 side and the third layer 27B being disposed on the second layer 26 on the active layer 3 side. The third layer 27A and the third layer 27B may have different thicknesses, compositions or electron carrier concentrations (n-type impurity concentrations), or the same thickness, composition or electron carrier concentration (n-type impurity concentration). Typically, all the thickness, composition and electron carrier concentration (n-type impurity concentration) are the same in the third layer 27A and in the third layer 27B.

Preferably, the third layer 27 has a thickness smaller than that of the second layer 26, and is composed of $In_cGa_{1-c}N$ (0≤c<1). Preferably, the In composition ratio c of the third layer 27 is lower than the In composition ratio b of the second layer 26, i.e. the relationship of c<b is satisfied. When the second layer 26 having a relatively high In composition ratio is provided, crystallinity may be deteriorated. However, by providing the third layer 27 composed of GaN or InGaN having a relatively low In composition ratio, crystallinity can be restored, so that the active layer 3 of high quality can be grown. More preferably, the third layer 27 is formed of GaN. The In composition ratio c of the third layer 27 may be equal to or lower than the In composition ratio a of the first layer 25, i.e. the relationship of c≤a may be satisfied. This relationship is suitable from the following reason. Specifically, it is preferred that the first layer 25 is formed of InGaN when the first layer 25 serves as a light guide layer, and on the other hand, it is preferred that the third layer 27 is formed of InGaN having a low In composition ratio, or GaN to serve as a crystallinity restoring layer.

The third layer 27 may contain an n-type impurity. Accordingly, overflow of holes can be reduced, and electrons can tunnel through to improve injection efficiency of carriers. Since the interfaces from the first layer 25 to the active layer 3 are heterointerfaces, band spikes occurs, and unless a region containing an n-type impurity is provided in these layers, spike noises easily occurs in the voltage characteristics. In this respect, it is important that the second layer 26 and the third layer 27 contain an n-type impurity. Examples of the n-type impurity include Si and Ge.

The electron carrier concentration of the third layer 27 is preferably $1 \times 10^{18}/cm^3$ or more. The electron carrier concentration of the third layer 27 can be set to be in the same range as that for the second layer 26. The third layer 27 may have an electron carrier concentration comparable to or higher than that of the second layer 26. The electron carrier concentration of the third layer 27 can be set in the similar manner as in the case of the second layer 26. Specifically, a sample having a large thickness is prepared for the Hall measurement, the measurement is conducted, and the third layer 27 is formed under the similar growth conditions as those for the sample with which a desired electron carrier concentration is obtained. The n-type impurity concentration of the third layer 27 may be the same as that of the second layer 26. When the third layer includes two third layers 27A and 27B, only one of them may contain an n-type impurity, or both of them may contain an n-type impurity. Preferably, both the third layers 27A and 27B contain an n-type impurity.

For obtaining a crystallinity restoring effect, the thickness of the third layer 27 is preferably greater than or equal to one atomic layer, and may be 0.5 nm or more. The thickness of the third layer 27 is preferably equal to or less than half of the thickness of the second layer 26. Specifically, the thickness of the third layer 27 is preferably 5 nm or less. The thickness of the third layer 27 may be smaller than the thickness of the barrier layer 32.

Preferably, the average In composition ratio f of the second layer 26 and the third layer 27 is higher than the In composition ratio of the first layer 25 and lower than the In composition ratio of the well layer 31. Further preferably, the average In composition ratio f of the second layer 26 and the at least one third layer 27 is equal to or less than half of the In composition ratio of the well layer 31. When the average In composition ratio f is in this range, the second layer 26 can effectively serve as a buffer layer for the active layer 3, and the third layer 27 can effectively serve as a crystallinity restoring layer. The average In composition ratio f of the second layer 26 and the third layer 27 can be determined from the following equation: $f=(b \times L_2 + c \times L_3)/(L_2+L_3)$, where b is the In composition ratio of the second layer 26, $L_2$ is the thickness of the second layer 26, c is the In composition ratio of the third layer 27, and $L_3$ is the thickness of the third layer 27. When the third layer 27 includes two third layers 27A and 27B, the average In composition ratio f may be determined from $c \times L_3 = c_A \times L_{3A} + c_B \times L_{3B}$ and $L_3 = L_{3A} + L_{3B}$, where $c_A$ is the In composition ratio of the third layer 27A, $L_{3A}$ is the thickness of the third layer 27A, $c_B$ is the In composition ratio of the third layer 27B, and $L_{3B}$ is the thickness of the third layer 27B. The In composition ratio a of the first layer 25, the In composition ratio b of the second layer 26 and the average In composition ratio f of the second layer 26 and the third layer 27 may satisfy the relationship of $0.025 \leq a \leq f < b \leq 0.2$. Accordingly, the second layer 26 and the third layer 27 can satisfactorily serve as a strain reducing layer while deterioration of the crystallinity of the active layer 3 is reduced.

The In composition ratios of the first layer 25, the second layer 26 and the third layer 27 can be set in such a manner that a difference in In composition ratio between the neighboring layers is 0.005 or more (0.5% or more) for at least one pair. The In composition ratios a to c of the first to third layers 25 to 27 may satisfy at least one of the relationships of $0.005 \leq |a-c|$, $0.005 \leq |c-b|$ and $0.005 \leq |a-b|$.

It is preferred that when a layer having the smallest lattice constant in the n-side region 2 is the n-type nitride semiconductor layer (third n-type semiconductor layer 23 in the examples shown in FIGS. 1 and 2), all the layers between the n-type nitride semiconductor layer and the active layer 3 except the third layer 27 are formed with such a composition that the lattice constant increases stepwise as going from the n-type nitride semiconductor layer to the active layer 3. Accordingly, strain on the active layer 3 can be effectively reduced.

The effect by providing the third layer 27 is easily enhanced particularly under pulsed operation. For example, comparing the optical output power under pulsed operation among a plurality of samples, the optical output power of a sample which is provided without the third layer but with the second layer is almost comparable to that of a sample with the second layer replaced by a Si-doped single GaN layer having the similar electron carrier concentration (comparative sample), whereas the optical output power of a sample provided with both the second layer and third layer is remarkably improved. In addition, under CW operation, even the sample without third layer but with second layer make better results as compared to the comparative sample in the evaluations of the threshold current, the slope efficiency, optical output power, wall-plug efficiency and the like as for temperature characteristics (ratio of change in characteristics at 80° C. with respect to characteristics at 20° C.). Accordingly, when characteristics at a high temperature under CW operation are considered important, the third layer may be omitted to provide the second layer.

Active Layer 3

The active layer 3 has a single quantum well structure or a multiple quantum well structure. For obtaining a sufficient gain in a nitride-based semiconductor laser device, the multiple quantum well structure is preferred. The active layer 3 having a multiple quantum well structure includes a plurality of well layers 31, and the barrier layer 32 sandwiched between the well layers 31. Here, the active layer 3 refers to a series of layers, and the outermost layers of the series of layers are well layers 31, and the barrier layer 32 of the active layer 3 refers to a barrier layer sandwiched between two well layers 31.

For the barrier layer 32, InGaN, GaN, AlGaN or the like, having a band gap energy larger than that of the well layer 31, can be used. In a semiconductor laser device having an laser emission wavelength of 430 nm or more, the well layer 31 has a relatively high In composition ratio, and therefore it is preferred that the barrier layer 32 is composed of InGaN or GaN so that a difference in lattice constant between the well layer 31 and the barrier layer 32 is not excessively large. Typically, the barrier layer 32 is composed of $In_dGa_{1-d}N$ ($0 \leq d < 1$), and the well layer 31 is composed of $In_eGa_{1-e}N$ ($0 < e < 1$). The barrier layer 32 is not limited to a single layer, and may include a plurality of layers. In the case of a semiconductor laser device having an laser emission wavelength of 430 nm or more, the In composition ratio e of the well layer 31 may be, for example, 0.10 or more (10% or more) although it somewhat increases or decreases when the layer structure other than that of the active layer is changed. While the upper limit of the In composition ratio e of the well layer 31 is not particularly limited, it may be, for example, 0.50 or less (50% or less). Here, the laser emission wavelength of the semiconductor laser device is considered to be 600 nm or less. Preferably, the well layer 31 is undoped for improvement of crystallinity and reduction of light absorption.

Preferably, the barrier layer 32 is different in at least any of n-type impurity concentration, composition and thickness from the second layer 26 and the third layer 27. For example, the barrier layer 32 is formed as a single layer of $In_dGa_{1-d}N$ (0≤d<1, d<b). Specifically, when the active layer 3 includes two well layers 31 and one barrier layer 32, one well layer 31 is disposed in contact with one surface of the barrier layer 32 composed of $In_dGa_{1-d}N$ (0≤d<1, d<b), and the other well layer 31 is disposed in contact with the other surface of the barrier layer 32. The barrier layer 32 is composed of, for example, undoped GaN. A layer having a thickness (e.g. 1 nm or less) smaller than the thickness of the barrier layer 32 can also be disposed between the barrier layer 32 and the well layer 31. The distance between the barrier layer 32 and the well layer 31 is preferably smaller than the thickness of the barrier layer 32 (e.g. 1 nm or less). The distance may be 0, i.e. the barrier layer 32 may be in contact with the well layer 31.

As described above, deterioration of slope efficiency by thinning the barrier layer 32 can be reduced by providing the second layer 26. Thus, the thickness of the barrier layer 32 may be 15 nm or less. Accordingly, the operating voltage can be decreased, and further, imbalance in gain for each well layer 31 can be reduced, so that the threshold current can be decreased. For example, the thickness of the barrier layer 32 may be smaller than the total thickness of the second layer and the third layer. The lower limit of the thickness of the barrier layer 32 may be greater than or equal to one atomic layer. When the active layer 3 includes a plurality of barrier layers 32, i.e. the active layer 3 includes three or more well layers 31, it is preferred that all the barrier layers 32 have a similar composition and thickness.

Preferably, the In composition ratio a of the first layer 25, the average In composition ratio f of the second layer 26 and the third layer 27, the In composition ratio b of the second layer 26 and the In composition ratio e of the well layer 31 satisfy the relationship of a≤f<b<e. Further preferably, the relationship of a≤f<b<e/2. When the composition ratio of the second layer 26 and the third layer 27 falls within this range, strain can be effectively reduced while deterioration of the crystallinity of the active layer 3 is reduced.

P-Side Region 4

The p-side region 4 can be formed as a single-layer or multi-layer structure composed of a nitride semiconductor layer. Examples of the p-type nitride semiconductor layer in the p-side region 4 may include layers composed of a nitride semiconductor containing a p-type impurity such as Mg. For example, the p-side region 4 includes a p-side barrier layer 41, a fourth layer 42, a first p-type semiconductor layer 43, a second p-type semiconductor layer 44 (one example of p-type nitride semiconductor layer) and a third p-type semiconductor layer 45 in this order from the active layer 3. Layers other than these layers may be included in the p-side region 4, or some of these layers may be omitted.

P-Side Barrier Layer 41

The p-side barrier layer 41 has a band gap energy larger than that of the well layer 31. The composition and thickness of the p-side barrier layer 41 may be in the same range as that for the barrier layer 32 of the active layer 3. Since when the p-side barrier layer 41 contains an n-type impurity, light absorption and trapping of holes may occur, and Mg that is a p-type impurity forms a deep level to cause light absorption, the p-side barrier layer 41 is preferably undoped. For example, the p-side barrier layer 41 is composed of undoped GaN. The p-side barrier layer 41 may be thinner than the barrier layer 32.

Fourth Layer 42

The fourth layer 42 is composed of, for example, InGaN or GaN. From the similar reason as in the case of the p-side barrier layer 41, the fourth layer 42 is preferably undoped, and serves as, for example, a p-side guide layer. Preferably, the fourth layer 42 has a band gap energy smaller than that of the p-side barrier layer 41. For example, when the p-side barrier layer 41 is formed from $In_gGa_{1-g}N$ (0≤g<1), the fourth layer 42 can be formed from $In_hGa_{1-h}N$ (0<h<1, g<h). The In composition ratios g and h may satisfy the relationship of 0.03≤h−g. The In composition ratio g is, for example, 0.03 or less. When the fourth layer 42 is composed of InGaN, crystallinity may be deteriorated as the thickness increases, and therefore the thickness of the fourth layer 42 is preferably 350 nm or less, further preferably 300 nm or less. Preferably, the thickness of the fourth layer 42 is in the same range when the fourth layer 42 is a composition gradient layer, the composition of which changes from InGaN to GaN. Preferably, the fourth layer 42 is different in any of composition and thickness from the second layer 26. The p-side barrier layer 41 and the fourth layer 42 may have such a composition and thickness that these layers are asymmetric to the second layer 26 and the third layer 27 with respect to the active layer 3 as shown in FIG. 1.

The fourth layer 42 may be a composition gradient layer. When the fourth layer is a composition gradient layer, it is preferred that the band gap energy on a side close to the active layer 3 is smaller than the band gap energy on a side far from the active layer 3 (p-type nitride semiconductor layer side). Preferably, a region of the composition gradient layer, which is closest to the active layer 3, has a composition in the composition range of $In_hGa_{1-h}N$, and for example, this region may have the same composition as that of the second layer 26. A region of the composition gradient layer, which is closest to the p-type nitride semiconductor layer, may have a band gap energy comparable to or larger than that of the p-side barrier layer 41, and is composed of, for example, GaN. It is preferred to avoid formation of a heterointerface having an abrupt band offset, such as InGaN/GaN, particularly formation of a plurality of heterojunctions, because this may provide a hole trapping interface. The composition gradient layer reduces overflow of electrons while inducing light to the active layer 3, and therefore it is effective to monotonously decrease the In composition from the active layer 3 side. Preferably, the fourth layer 42 does not have an abrupt band offset of about 0.004 eV/nm or more over all regions except an interface of the fourth layer 42 on the active layer 3 side and an interface of the fourth layer 42 on the p-type nitride semiconductor layer side. In other words, an abrupt variation in composition ratio, which is equivalent to about 0.001/nm (about 0.1%/nm) or more in terms of the In composition ratio in InGaN, does not exist.

First to Third P-Type Semiconductor Layers 43 to 45

The first to third p-type semiconductor layers 43 to 45 contain a p-type impurity such as Mg. The first p-type semiconductor layer 43 is composed of, for example, AlGaN. The first p-type semiconductor layer 43 may be provided as a layer having the largest band gap energy in the p-side region 4 and having a thickness smaller than that of the fourth layer 42. The first p-type semiconductor layer 43 serves as, for example, an electron blocking layer. The second p-type semiconductor layer 44 (this layer is defined as a p-type nitride semiconductor layer in this embodiment) is composed of, for example, AlGaN. The second p-type semiconductor layer 44 serves as, for example, a p-type clad layer, and may have the second largest band gap energy after the electron blocking layer in the p-side region 4. The first p-type semiconductor layer 43 and the second p-type semiconductor layer 44 can also be integrated with each other to provide one layer that serves as both an electrode blocking layer and a p-type clad layer. The third p-type semiconductor layer 45 is composed of, for example, GaN, and serves as a p-type contact layer.

N-Electrode 8, P-Electrode 6 and P-Side Pad Electrode 7

The n-electrode 8 is provided, for example, over the almost entire region of the lower surface of the n-type substrate 1. The p-electrode 6 is provided, for example, on at least the upper surface of the ridge 4a. When the width of the p-electrode 6 is small, the p-side pad electrode 7 having a width larger than that of the p-electrode 6 is provided on the p-electrode 6, and a wire etc. is connected to the p-side pad electrode 7. Here, the material of each electrodes is not particularly limited, and examples thereof include single-layer films or multi-layer films of a metal such as Ni, Rh, Cr, Au, W, Pt, Ti or Al or alloys thereof, and a conductive oxide etc. containing at least one selected from Zn, In and Sn. Examples of the conductive oxide include ITO (indium tin oxide), IZO (indium zinc oxide) and GZO (gallium-doped zinc oxide). The thickness of the electrode is not particularly limited, can be appropriately adjusted according to, for example, a material to be used, and may be a thickness which ensures that the electrode can serve as an electrode of a semiconductor device. The thickness of the electrode is, for example, about 0.1 µm to 2 µm.

First and Second Insulating Films 5a and 5b

Preferably, the first insulating film 5a and the second insulating film 5b are provided on a main surface of a semiconductor stacked-layer body. Preferably, the second insulating film 5b is provided at side surfaces of the semiconductor stacked-layer body for preventing leakage. The first and second insulating films 5a and 5b can be formed from, for example, a single-layer or multi-layer film of an oxide or nitride of Si, Al, Zr, Ti, Nb, Ta or the like. The thickness of each of first and second insulating films 5a and 5b is not particularly limited, and may be, for example, about 10 nm to 500 nm.

Method of Manufacturing the Semiconductor Laser Device 100

The method of manufacturing the semiconductor laser device 100 according to this embodiment may include the following steps A to E in this order. A step C' may be employed in place of the step C.

(Step A) An n-type nitride semiconductor layer (e.g. third n-type semiconductor layer 23) is formed.

(Step B) The first layer 25 composed of $In_aGa_{1-a}N$ ($0 \leq a < 1$) is formed above the n-type nitride semiconductor layer.

(Step C) The second layer 26 and the third layer 27 are formed above the first layer 25. It is preferred that the second layer 26 has a thickness smaller than that of the first layer 25, and is composed of $In_bGa_{1-b}N$ ($0 < b < 1$, $a < b$), and the second layer 26 is formed with an n-type impurity doped in such a manner that the electron carrier concentration is $1 \times 10^{18}/cm^3$ or more. It is preferred that the third layer 27 is disposed on at least any one of a surface of the second layer 26 on the active layer 3 side and a surface of the second layer 26 on the first layer 25 side, and the third layer 27 has a thickness smaller than that of the second layer 26, and is composed of $In_cGa_{1-c}N$ ($0 \leq c < 1$, $c < b$).

(Step C') The second layer 26 and the third layer 27 are formed above the first layer 25. It is preferred that the second layer 26 has a thickness smaller than that of the first layer 25, and is composed of $In_bGa_{1-b}N$ ($0 < b < 1$, $a < b$), and the second layer 26 is formed with an n-type impurity doped in such a manner that the n-type impurity concentration is $1 \times 10^{19}/cm^3$ or more. It is preferred that the third layer 27 is disposed on at least any one of a surface of the second layer 26 on the active layer 3 side and a surface of the second layer 26 on the first layer 25 side, and the third layer 27 has a thickness smaller than that of the second layer 26, and is composed of $In_cGa_{1-c}N$ ($0 \leq c < 1$, $c < b$).

(Step D) The active layer 3 having a single-layer quantum well structure or a multi-layer quantum well structure is formed above the second layer 26 and the third layer 27.

(Step E) A p-type nitride semiconductor layer (e.g. second p-type semiconductor layer 44) is formed above the active layer 3.

Accordingly, the semiconductor laser device 100 can be manufactured which is capable of reducing the piezoelectric field while suppressing deterioration of crystallinity and which is capable of improving electron injection efficiency and reducing overflow of holes. Other configurations are shown below as examples, but the present invention is not limited thereto. As the configuration of the semiconductor laser device 100 and the configurations of members included therein, the above-mentioned configurations can be employed. As described above, some layers can be omitted, and layers other than those mentioned here may be included. The electron carrier concentration and the n-type impurity concentration are set in the manner described above, and layers (e.g. second layer 26) in the semiconductor laser device 100 may be formed under the similar growth conditions as conditions under which a desired concentration is obtained with a sample for the Hall measurement.

Preferably, the active layer 3 has a multiple quantum well structure including a plurality of well layers 31 and a barrier layer 32 sandwiched between the well layers 31, and the barrier layer 32 is different in at least any of n-type impurity concentration, composition and thickness from the second layer 26 and the third layer 27. Preferably, the third layer 27 is formed with an n-type impurity doped thereto.

The layers can be formed using, for example, a metal organic chemical vapor deposition (MOCVD). As the growth temperature for each of the first to third layers 25 to 27, for example, the growth temperature $T_1$ in formation of the first layer 25, the growth temperature $T_2$ in formation of the second layer 26, and the growth temperature $T_3$ in formation of the third layer 27 may satisfy the relationships of $|T_1-T_2| \leq 150$ and $|T_3-T_1| \leq 150$. Any one of the relationships of $T_1 \geq T_2$ and $T_3 \geq T_1$ may be satisfied, and it is preferred that both of the relationships are satisfied. Accordingly, the first to third layers can be grown with high crystallinity. $T_1$ to $T_3$ are temperatures on the centigrade scale.

After the layers are grown, a step of forming the ridge 4a, a step of forming the first insulating film 5a (and the second insulating film 5b), a step of reducing the thickness of the substrate 1 by polishing etc., a step of forming the n-electrode 8 and the p-electrode 6 (and the p-side pad electrode 7), and the like can be optionally employed. Normally, stacking layers epitaxially grown on a wafer-shaped substrate, and forming each electrode etc., followed by performing dicing is carried out. After the dicing step or during the dicing step, a step of forming a reflective film such as a dielectric multi-layer film on cleaved surfaces etc. of cavity resonator end may be carried out.

Experimental Samples 1 to 3

Semiconductor laser devices as shown below were prepared as experimental samples 1 to 3. For preparing an epitaxial wafer to be formed into a semiconductor laser device, MOCVD was used. As precursors, trimethyl gallium (TMG), triethyl gallium (TEG), trimethyl aluminum (TMA), trimethyl indium (TMI), ammonia ($NH_3$), a silane gas and bis(cyclopentadienyl) magnesium ($Cp_2Mg$) were appropriately used.

On a c-plane GaN substrate, a Si-doped $Al_{0.02}Ga_{0.98}N$ layer was grown with a thickness of 1.5 μm. Next, a Si-doped $In_{0.05}Ga_{0.95}N$ layer was grown with a thickness of 150 nm. Next, a Si-doped $Al_{0.07}Ga_{0.93}N$ layer was grown with a thickness of 900 nm. Next, a Si-doped GaN layer was grown with a thickness of 300 nm. Next, an undoped $In_{0.03}Ga_{0.97}N$ layer (first layer) was grown with a thickness of 190 nm. Layers to be grown next were formed with different structures among experimental samples 1 to 3. Specific structures will be described later. Next, an active layer was grown. As the active layer, an undoped $In_{0.14}Ga_{0.86}N$ layer (well layer) was grown with a thickness of 3.5 nm, and an undoped GaN layer (barrier layer) was grown thereon with a thickness of 3.5 nm. Further, an $In_{0.14}Ga_{0.86}N$ layer (well layer) was grown thereon with a thickness of 3.5 nm. Next, an undoped GaN layer was grown with a thickness of 1 nm. Next, an undoped $In_{0.035}Ga_{0.965}N$ layer was grown with a thickness of 190 nm. Next, a Mg-doped $Al_{0.12}Ga_{0.88}N$ layer was grown with a thickness of 3 nm, and a Mg-doped $Al_{0.16}Ga_{0.84}N$ layer was grown with a thickness of 6 nm. Next, an $Al_{0.04}Ga_{0.96}N$ layer partially doped with Mg was grown with a thickness of 500 nm. Finally, a Mg-doped GaN layer was grown with a thickness of 15 nm. The epitaxial wafer provided with these layers was taken out from the MOCVD reactor, a ridge, a n-electrode and a p-electrode were formed by photolithography, RIE and sputtering, and dicing was performed to obtain a semiconductor laser device. The semiconductor laser device had a ridge width of 30 μm and a cavity length of 1200 μm.

The layers formed between the first layer and the active layer are as follows. In the experimental sample 1, an undoped GaN layer was grown with a thickness of 1 nm. In the experimental sample 2, a Si-doped GaN layer was grown with a thickness of 10 nm. The layer was formed under the same growth conditions as growth conditions under which an electron carrier concentration of $3\times10^{18}/cm^3$ had been obtained with a sample for the Hall measurement. In the experimental sample 3, a Si-doped GaN layer was grown with a thickness of 10 nm. The layer was formed under the same growth conditions as growth conditions under which an electron carrier concentration of $1\times10^{19}/cm^3$ had been obtained with a sample for the Hall measurement.

Figure 3:
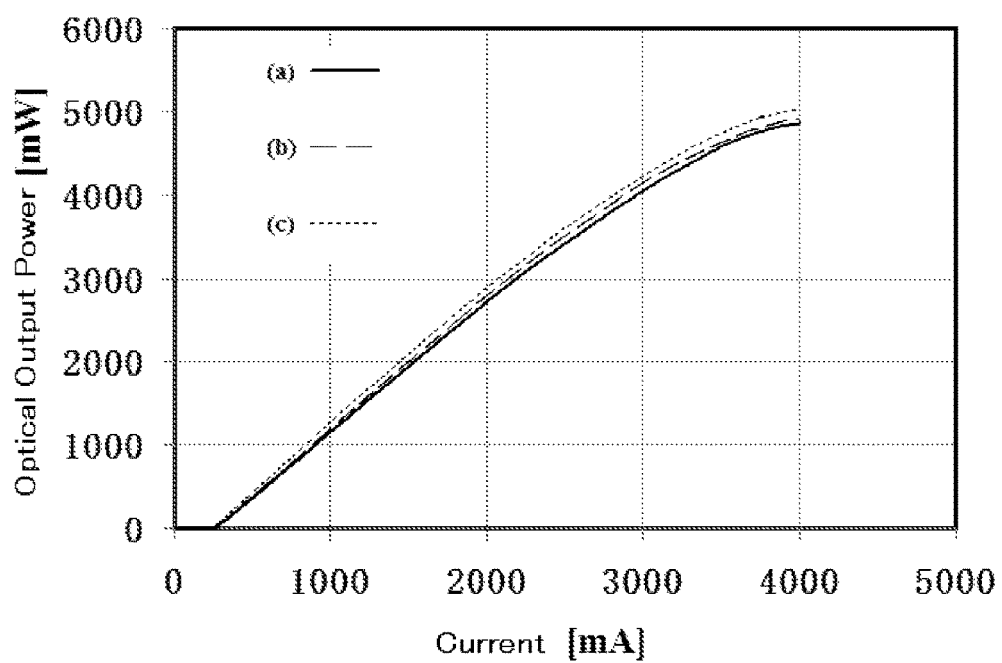
FIG. 3 is a graph showing the I-L characteristics of semiconductor laser devices of experimental samples 1 to 3.

FIG. 3 shows the I-L characteristics of semiconductor laser devices of experimental samples 1 to 3. The solid line (a) corresponds to the experimental sample 1, the large-interval broken line (b) corresponds to the experimental sample 2, and the small-interval broken line (c) corresponds to the experimental sample 3. Each of laser emission wavelengths of the semiconductor laser devices of experimental examples 1 to 3 was 445 nm. The threshold current was 266 mA for the experimental sample 1, 257 mA for the experimental sample 2, and 247 mA for the experimental sample 3. The slope efficiency was 1.60 W/A for the experimental sample 1, 1.61 W/A for the experimental sample 2, and 1.70 W/A for the experimental sample 3. The optical output power, the voltage and the wall-plug efficiency at a current of 2.5 A were, respectively, 3412 mW, 4.60 V and 29.7% for the experimental sample 1, 3510 mW, 4.61 V and 30.5% for the experimental sample 2, and 3606 mW, 4.60 V and 31.4% for the experimental sample 3.

From these results, it can be understood that when a layer between the first layer and the active layer is a Si-doped layer as in experimental samples 2 and 3 rather than an undoped layer as in the experimental sample 1, the threshold current decreases, and the optical output power increases, so that the wall-plug efficiency is improved. From the results for experimental samples 2 and 3, it can be understood that these effects become more satisfactory as the electron carrier concentration increases. The reason the thickness of the layer between the first layer and the active layer in the experimental sample 1 was smaller than that in experimental samples 2 and 3 is that it is considered that as long as the layer is thin, the layer, even when it is undoped, hardly hinders injection of electrons, so that negative influences on characteristics are relatively small. If the undoped layer in the experimental sample 1 is provided with the same thickness as in experimental samples 2 and 3, a difference of characteristics between the experimental sample 1 and the experimental samples 2 and 3 may be greater.

Example 1

In Example 1, a semiconductor laser device as shown below was prepared. The semiconductor laser device was prepared in the same manner as in the case of experimental samples 1 to 3 except for the structures and dimensions of semiconductor layers.

On a c-plane GaN substrate, a Si-doped $Al_{0.02}Ga_{0.98}N$ layer was grown with a thickness of 1.5 μm. Next, a Si-doped $In_{0.05}Ga_{0.95}N$ layer was grown with a thickness of 150 nm. Next, a Si-doped $Al_{0.07}Ga_{0.93}N$ layer was grown with a thickness of 900 nm. Next, a Si-doped GaN layer was grown with a thickness of 300 nm. Next, an undoped $In_{0.03}Ga_{0.97}N$ layer (first layer) was grown with a thickness of 250 nm. Next, a Si-doped GaN layer (third layer) was grown with a thickness of 1 nm, a Si-doped $In_{0.05}Ga_{0.95}N$ layer (second layer) was grown with a thickness of 8 nm, and a Si-doped GaN layer (third layer) was grown with a thickness of 1 nm. These layers were formed under the same growth conditions as growth conditions under which an electron carrier concentration of $1.7\times10^{19}/cm^3$ had been obtained with a sample for the Hall measurement. Next, an active layer was grown. As the active layer, an undoped $In_{0.15}Ga_{0.85}N$ layer (well layer) was grown with a thickness of 3.4 nm, and an undoped GaN layer (barrier layer) was grown thereon with a thickness of 2 nm. Further, an $In_{0.15}Ga_{0.85}N$ layer (well layer) was grown thereon with a thickness of 3.4 nm. Next, an undoped GaN layer was grown with a thickness of 1.2 nm. Next, an undoped composition gradient layer was grown with a thickness of 250 nm. The composition gradient layer was grown while the In composition ratio was monotonously decreased as going from the active layer side to the opposite side with the composition set to $In_{0.05}Ga_{0.95}N$ on the active layer side and to GaN on the opposite side. Next, a Mg-doped $Al_{0.16}Ga_{0.84}N$ layer was grown with a thickness of 10 nm. Next, an $Al_{0.04}Ga_{0.96}N$ layer partially doped with Mg was grown with a thickness of 300 nm. Finally, a Mg-doped GaN layer was grown with a thickness of 15 nm. The semiconductor laser device had a ridge width of 45 μm and a cavity length of 1200 μm.

Except that a "Si-doped GaN layer with a thickness of 10 nm" was grown in place of the "Si-doped GaN layer with a thickness of 1 nm (third layer)/Si-doped $In_{0.05}Ga_{0.95}N$ layer with a thickness of 8 nm (second layer)/Si-doped GaN layer with a thickness of 1 nm (third layer)" in Example 1, the similar procedure as in Example 1 was carried out to prepare a semiconductor laser device as Comparative Example 1. The layer in Comparative Example 1 was formed under the same growth conditions as growth conditions under which an electron carrier concentration of $1.7 \times 10^{19}/cm^3$ had been obtained with a sample for the Hall measurement. In Comparative Example 1, a GaN single layer having the same thickness as the total thickness of the second layer and the third layer in Example 1 and the same electron carrier concentration as that of these layers was provided at the same position as that of these layers.

Figure 4:
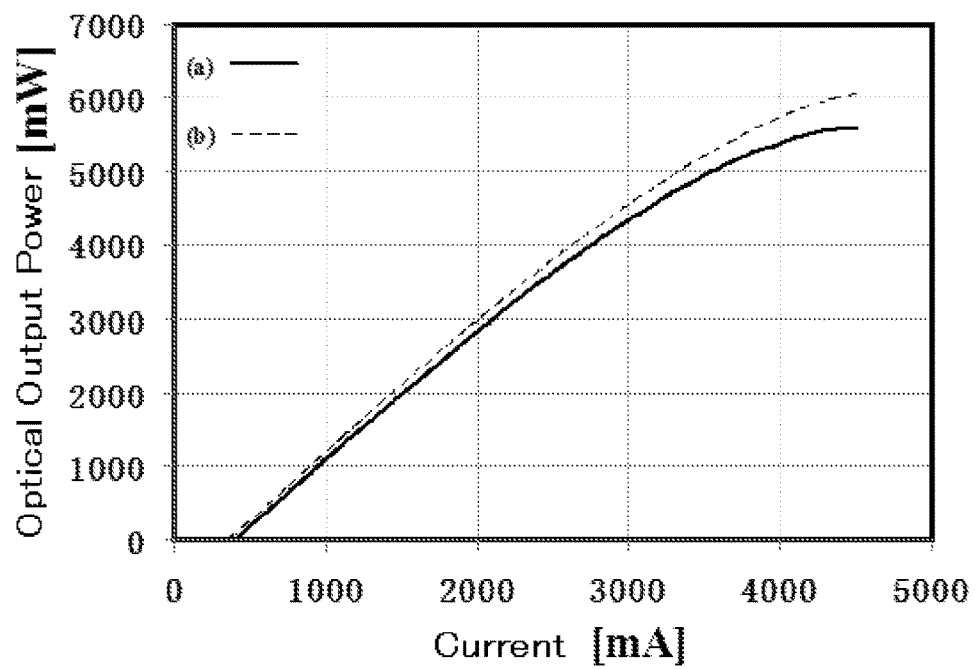
FIG. 4 is a graph showing the I-L characteristics of semiconductor laser devices in Example 1 and Comparative Example 1.

FIG. 4 shows the I-L characteristics of semiconductor laser device in Example 1 and Comparative Example 1. The solid line (a) corresponds to the semiconductor device in Comparative Example 1, and the broken line (b) corresponds to the semiconductor laser device in Example 1. Each of laser emission wavelengths of the semiconductor laser device in Example 1 and Comparative Example 1 is 455 nm. The threshold current was 396 mA for Comparative Example 1, and 361 mA for Example 1. The slope efficiency was 1.54 W/A for Comparative Example 1, and 1.65 W/A for Example 1. The optical output power, the voltage and the wall-plug efficiency at a current of 3 A were, respectively, 4350 mW, 4.16 V and 34.8% for Comparative Example 1, and 4550 mW, 4.21 V and 36.1% for Example 1.

The semiconductor laser device in Example 1 had a lower threshold current and a higher optical output power and wall-plug efficiency as compared to the semiconductor laser device in Comparative Example 1. The reason characteristics were improved in Example 1 as compared to Comparative Example 1 may be that as described above, the piezoelectric field was reduced and the light confinement coefficient was improved by providing the InGaN layer (second layer), crystallinity was restored by providing the GaN layer (third layer) on each of both sides of the second layer, and electron injection efficiency was improved and overflow of holes was reduced because the electron carrier concentration was sufficient.

Example 2

Except that the ridge width was 15 µm, and the following layers were grown after the active layer, the similar procedure as in Example 1 was carried out to prepare a semiconductor laser device in Example 2. The layers grown after the active layer in Example 2 include an undoped GaN layer with a thickness of 1.2 nm, an undoped composition gradient layer with a thickness of 250 nm ($In_{0.05}Ga_{0.95}N$ on the active layer side and GaN on the opposite side), a Mg-doped $Al_{0.12}Ga_{0.88}N$ layer with a thickness of 3 nm, a Mg-doped $Al_{0.16}Ga_{0.84}N$ layer with a thickness of 6 nm, an $Al_{0.04}Ga_{0.96}N$ layer partially doped with Mg with a thickness of 300 nm, and a Mg-doped GaN layer with a thickness of 15 nm, in this order from the active layer.

Except that a "Si-doped GaN layer with a thickness of 10 nm" was grown in place of the "Si-doped GaN layer with a thickness of 1 nm (third layer)/Si-doped $In_{0.05}Ga_{0.95}N$ layer with a thickness of 8 nm (second layer)/Si-doped GaN layer with a thickness of 1 nm (third layer)" in Example 2, the similar procedure as in Example 2 was carried out to prepare a semiconductor laser device in Comparative Example 2 for comparison.

Figure 5:
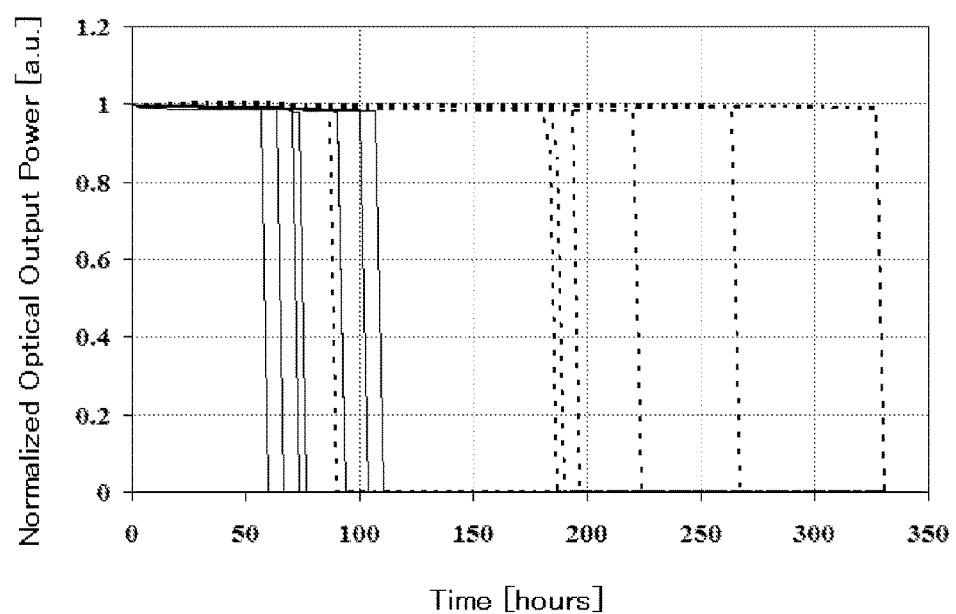
FIG. 5 is a graph showing a normalized optical output power versus an aging time for semiconductor laser devices in Example 2 and Comparative Example 2.

FIG. 5 shows the results of continuously driving eight semiconductor laser devices in each of Example 2 and Comparative Example 2 under pulsed operation with a current of 4.8 A at a case temperature of 25 degrees. In FIG. 5, the horizontal axis represents an aging time after the start of driving and the vertical axis represents an optical output power which is normalized by optical output power at 0 hour. The solid line corresponds to results for the semiconductor laser device in Comparative Example 2, and the broken line corresponds to results for the semiconductor device in Example 2. In FIG. 5, the time at which the normalized optical output power rapidly decreases to zero may be the time at which the semiconductor laser device suddenly dies. The time until the sudden death is less than 120 hours for all the samples in Comparative Example 2, whereas in Example 2, the time until the sudden death is less than 120 hours for only one sample, and for other samples, the time until the sudden death is almost twice as long as that in the comparative example. From these results, it is considered that by providing the second layer and the third layer, the time until sudden death can be increased to extend the lifetime. In the graph in FIG. 5, there seem seven lines for Example 2 (broken lines) and seven lines for Comparative Example 2 (solid lines) because some of the lines overlap, but actually, there are eight lines for Example 2 and eight lines for Comparative Example 2. In Example 2, there are two lines in which the optical output power becomes 0 at around 330 hours, and Comparative Example 2, there are two lines in which the optical output power becomes 0 at around 90 hours. The results shown in FIG. 5 are results of performing the operation under the accelerated test condition, and the actual lifetime may be still longer under normal use conditions.

The semiconductor laser device according to certain embodiments of the present invention can be used in light sources for displays such as projectors and televisions, and in light sources for medical use and light sources for headlights of vehicles.

What is claimed is:
1. A semiconductor laser device comprising:
an n-type nitride semiconductor layer;
a first layer disposed above the n-type nitride semiconductor layer and comprising $In_aGa_{1-a}N$ (0<a<1);
a second layer disposed above the first layer, wherein the second layer comprises $In_bGa_{1-b}N$ (0<b<1, a<b) and contains an n-type impurity, and wherein the second layer has a thickness smaller than that of the first layer;
a third layer disposed on a surface of the second layer at a location between the first layer and the second layer, wherein the third layer comprises $In_cGa_{1-c}N$ (0≤c<1, c<b) and contains an n-type impurity, wherein the third layer has a thickness smaller than that of the second layer, wherein an In composition ratio of the third layer is lower than an In composition ratio of the first layer at an interface between the first layer and the third layer, wherein a difference between the In composition ratio of the first layer and the In composition ratio of the third layer is 0.5% or more, and wherein a difference between an In composition ratio of the second layer and the In composition ratio of the third layer is 0.5% or more;
an active layer disposed above the second layer and the third layer, and having a single quantum well structure or a multiple quantum well structure; and
a p-type nitride semiconductor layer disposed above the active layer, wherein the semiconductor laser device has a laser emission wavelength of 430 nm or more.

2. The semiconductor laser device according to claim 1, wherein:
the active layer has a multiple quantum well structure including a plurality of well layers, and a barrier layer sandwiched between the well layers, and
the barrier layer is different from the second layer and the third layer with respect to at least one of (i) n-type impurity concentration, and/or (ii) composition, and/or (iii) thickness.

3. The semiconductor laser device according to claim 2, wherein the barrier layer is a single layer of $In_dGa_{1-d}N$ ($0 \le d < 1$, $d < b$).

4. The semiconductor laser device according to claim 1, wherein the electron carrier concentration of the second layer is $1 \times 10^{18}/cm^3$ or more.

5. The semiconductor laser device according to claim 1, wherein the n-type impurity concentration of the second layer is $1 \times 10^{19}/cm^3$ or more.

6. The semiconductor laser device according to claim 1, wherein the electron carrier concentration of the third layer is $1 \times 10^{18}/cm^3$ or more.

7. The semiconductor laser device according to claim 1, wherein the third layer comprises GaN.

8. The semiconductor laser device according to claim 1, wherein the thickness of the second layer is not less than 1 nm and not more than 30 nm.

9. The semiconductor laser device according to claim 1, wherein the thickness of the third layer is greater than or equal to one atomic layer, and equal to or less than half of the thickness of the second layer.

10. The semiconductor laser device according to claim 1, wherein
the active layer includes a well layer comprising $In_e Ga_{1-e}N$ ($0 < e < 1$); and
when:
a is the In composition ratio of the first layer,
b is the In composition ratio of the second layer,
c is the In composition ratio of the third layer,
e is the In composition ratio of the well layer,
$L_2$ is the thickness of the second layer,
$L_3$ is the thickness of the third layer, and
$f = (b \times L2 + c \times L3)/(L2+L3)$,
a, b, e, and f satisfy the relationship $a \le f < b < e$.

11. A semiconductor laser device comprising:
an n-type nitride semiconductor layer;
a first layer disposed above the n-type nitride semiconductor and comprising $In_aGa_{1-a}N$ ($0 < a < 1$);
a second layer disposed above the first layer, wherein the second layer comprises $In_bGa_{1-b}N$ ($0 < b < 1$, $a < b$) and contains an n-type impurity, and where the second layer has a thickness smaller than that of the first layer;
a third layer disposed on a surface of the second layer on a first layer side, wherein the third layer comprises $In_{cA}Ga_{1-cA}N$ ($0 \le c_A < 1$, $c_A < b$) and contains an n-type impurity, wherein the third layer has a thickness smaller than that of the second layer, wherein an In composition ratio of the third layer is lower than an In composition ratio of the first layer at an interface between the first layer and the third layer, wherein a difference between the In composition ratio of the first layer and the In composition ratio of the third layer is 0.5% or more, and wherein a difference between an In composition ratio of the second layer and the In composition ratio of the third layer is 0.5% or more;

a fourth layer disposed on a surface of the second layer on an active layer side wherein the fourth layer comprises $In_{cB}Ga_{1-cB}N$ ($0 \le c_B < 1$, $c_B < b$), and wherein the fourth layer has a thickness smaller than that of the second layer,
an active layer disposed above the third and fourth layers and having a single quantum well structure or a multiple quantum well structure; and
a p-type nitride semiconductor layer disposed above the active layer,
wherein the semiconductor laser device has a laser emission wavelength of 430 nm or more.

12. The semiconductor laser device according to claim 11, wherein the electron carrier concentration of the second layer is $1 \times 10^{18}/cm^3$ or more.

13. The semiconductor laser device according to claim 11, wherein the third layer and the fourth layer comprise GaN.

14. The semiconductor laser device according to claim 11, wherein
the active layer includes a well layer comprising $In_e Ga_{1-e}N$ ($0 < e < 1$); and
when:
a is the In composition ratio of the first layer,
b is the In composition ratio of the second layer,
$c_A$ is the In composition ratio of the third layer,
$c_B$ is the In composition ratio of the fourth layer,
e is the In composition ratio of the well layer,
$L_2$ is the thickness of the second layer,
$L_{3A}$ is a thickness of the third layer,
$L_{3B}$ is a thickness of the fourth layer, and
$f=(b \times L_2 + c_A \times L_{3A} + c_B \times L_{3B})/(L_2+L_{3A}+L_{3B})$,
a, b, e, and f satisfy the relationship $a \le f < b < e$.

15. A method of manufacturing a semiconductor laser device, comprising:
forming an n-type nitride semiconductor layer;
forming a first layer comprising $In_aGa_{1-a}N$ ($0 < a < 1$) above the n-type nitride semiconductor layer;
forming a second layer and a third layer above the first layer,
wherein the second layer comprises $In_bGa_{1-b}N$ ($0 < b < 1$, $a < b$) and contains an n-type impurity so as to have an electron carrier concentration of $1 \times 10^{18}/cm^3$ or more, and wherein the second layer has a thickness smaller than that of the first layer,
wherein the third layer is disposed on a surface of the second layer at a location between the first layer and the second layer, wherein the third layer comprises $In_cGa_{1-c}N$ ($0 \le c < 1$, $c < b$) and contains an n-type impurity, wherein the third layer has a thickness smaller than that of the second layer, wherein an In composition ratio of the third layer is lower than an In composition ratio of the first layer at an interface between the first layer and the third layer, wherein a difference between the In composition ratio of the first layer and the In composition ratio of the third layer is 0.5% or more, and wherein a difference between an In composition ratio of the second layer and the In composition ratio of the third layer is 0.5% or more;
forming an active layer having a single quantum well structure or a multiple quantum well structure above the second layer and the third layer; and
forming a p-type nitride semiconductor layer above the active layer.

16. The method of manufacturing a semiconductor laser device according to claim 15, wherein:

the active layer has a multiple quantum well structure including a plurality of well layers, and a barrier layer sandwiched between the well layers; and the barrier layer is different from the second layer and the third layer with respect to at least one of (i) n-type impurity concentration, and/or (ii) composition, and/or (iii) thickness.

17. The method of manufacturing a semiconductor laser device according to claim 15, wherein a growth temperature $T_1$ in formation of the first layer, a growth temperature $T_2$ in formation of the second layer, and a growth temperature $T_3$ in formation of the third layer satisfy the relationship $|T_1-T_2|\leq 150$ and $|T_3-T_1|\leq 150$.

18. A method of manufacturing a semiconductor laser device, comprising:

forming an n-type nitride semiconductor layer;

forming a first layer composed of $In_aGa_{1-a}N$ (0<a<1) above the n-type nitride semiconductor layer;

forming a second layer and a third layer above the first layer, wherein the second layer comprises $In_bGa_{1-b}N$ (0<b<1, a<b) and contains an n-type impurity so as to have an n-type impurity concentration of $1\times 10^{19}/cm^3$ or more, having and wherein the second layer has a thickness smaller than that of the first layer, wherein the third layer is disposed on a surface of the second layer at a location between the first layer and the second layer, wherein the third layer comprises $In_cGa_{1-c}N$ (0≤c<1, c<b) and contains an n-type impurity, wherein the third layer has a thickness smaller than that of the second layer, wherein an In composition ratio of the third layer is lower than an In composition ratio of the first layer at an interface between the first layer and the third layer, wherein a difference between the In composition ratio of the first layer and the In composition ratio of the third layer is 0.5% or more, and wherein a difference between an In composition ratio of the second layer and the In composition ratio of the third layer is 0.5% or more;

forming an active layer having a single quantum well structure or a multiple quantum well structure above the second layer and the third layer; and forming a p-type nitride semiconductor layer above the active layer.

19. The semiconductor laser device according to claim 1, wherein:

the In composition ratio of the first layer is greater than or equal to 0.025 and less than or equal to 0.2, and the In composition ratio of the second layer is greater than or equal to 0.025 and less than or equal to 0.2.

20. The semiconductor laser device according to claim 11, wherein:

the In composition ratio of the first layer is greater than or equal to 0.025 and less than or equal to 0.2, and the In composition ratio of the second layer is greater than or equal to 0.025 and less than or equal to 0.2.

21. The method of manufacturing a semiconductor laser device according to claim 15, wherein:

the In composition ratio of the first layer is greater than or equal to 0.025 and less than or equal to 0.2, and the In composition ratio of the second layer is greater than or equal to 0.025 and less than or equal to 0.2.

22. The method of manufacturing a semiconductor laser device according to claim 18, wherein:

the In composition ratio of the first layer is greater than or equal to 0.025 and less than or equal to 0.2, and the In composition ratio of the second layer is greater than or equal to 0.025 and less than or equal to 0.2.

* * * * *